(12) United States Patent
Alamouti et al.

(10) Patent No.: US 6,853,688 B2
(45) Date of Patent: *Feb. 8, 2005

(54) LOW COMPLEXITY MAXIMUM LIKELIHOOD DETECTION OF CONCATENATED SPACE CODES FOR WIRELESS APPLICATIONS

(75) Inventors: Siavash Alamouti, Kirkland, WA (US); Patrick Poon, Lamtin (HK); Vahid Tarokh, Hackensack, NJ (US)

(73) Assignee: Cingular Wireless II, LLC, Redmond, WA (US)

( * ) Notice: Subject to any disclaimer, the term of this patent is extended or adjusted under 35 U.S.C. 154(b) by 74 days.

This patent is subject to a terminal disclaimer.

(21) Appl. No.: 10/334,343

(22) Filed: Dec. 30, 2002

(65) Prior Publication Data

US 2003/0133516 A1 Jul. 17, 2003

Related U.S. Application Data

(60) Continuation of application No. 10/005,095, filed on Dec. 3, 2001, which is a division of application No. 09/167,422, filed on Oct. 5, 1998, now Pat. No. 6,501,803.
(60) Provisional application No. 60/063,794, filed on Oct. 31, 1997.

(51) Int. Cl.[7] .............................. H04L 5/12; H04B 7/06
(52) U.S. Cl. ..................... 375/265; 375/267; 714/792
(58) Field of Search .............................. 375/265, 267, 375/260, 295; 714/792, 786

(56) References Cited

U.S. PATENT DOCUMENTS

| | | |
|---|---|---|
| 3,633,107 A | 1/1972 | Brady |
| 3,978,408 A | 8/1976 | Gupta et al. |
| 4,001,692 A | 1/1977 | Fenwick et al. |
| 4,099,121 A | 7/1978 | Fang |
| 4,369,516 A | 1/1983 | Byrns |
| 4,567,464 A | 1/1986 | Siegel et al. |
| 4,577,332 A | 3/1986 | Brenig |
| 4,675,880 A | 6/1987 | Davarian |
| 4,733,402 A | 3/1988 | Monsen |
| 4,763,331 A | 8/1988 | Matsumoto |
| 4,953,183 A | 8/1990 | Bergmans et al. |
| 5,022,053 A | 6/1991 | Chung et al. |
| 5,029,185 A | 7/1991 | Wei |
| 5,088,113 A | 2/1992 | Wei |
| 5,101,501 A | 3/1992 | Gilhousen et al. |
| 5,109,390 A | 4/1992 | Gilhousen et al. |
| 5,202,903 A | 4/1993 | Okanoue |
| 5,283,780 A | 2/1994 | Schuchman et al. |

(List continued on next page.)

FOREIGN PATENT DOCUMENTS

| | | |
|---|---|---|
| CA | 2252664 | 11/1997 |
| CA | 2302289 | 3/1998 |
| CA | 2276207 | 2/2003 |

(List continued on next page.)

OTHER PUBLICATIONS

Seshadri, N. et al., "Two Signaling Schemes for Improving the Error Performance of FDD Transmission Systems Using Transmitter Antenna Diversity," *Proceeding of the 1993 IEEE Vehicular Technology Conference* (VTC 43$^{rd}$), pp. 508–511, May 1993.

(List continued on next page.)

*Primary Examiner*—Temesghen Ghebretinsae
*Assistant Examiner*—D Savoy
(74) *Attorney, Agent, or Firm*—Perkins Coie LLP

(57) ABSTRACT

Good transmission characteristics are achieved in the presence of fading with a transmitter that employs a trellis coder followed by a block coder. Correspondingly, the receiver comprises a Viterbi decoder followed by a block decoder. Advantageously, the block coder and decoder employ time-space diversity coding which, illustratively, employs two transmitter antennas and one receiver antenna.

15 Claims, 1 Drawing Sheet

U.S. PATENT DOCUMENTS

| | | | |
|---|---|---|---|
| 5,305,353 | A | 4/1994 | Weerackody |
| 5,319,677 | A | 6/1994 | Kim |
| 5,396,518 | A | 3/1995 | How |
| 5,416,797 | A | 5/1995 | Gilhousen et al. |
| 5,418,798 | A | 5/1995 | Wei |
| 5,442,627 | A | 8/1995 | Viterbi et al. |
| 5,457,712 | A | 10/1995 | Weerackody |
| 5,461,646 | A | 10/1995 | Anvari |
| 5,461,696 | A | 10/1995 | Frank et al. |
| 5,479,448 | A | 12/1995 | Seshadri |
| 5,481,572 | A | 1/1996 | Sköld et al. |
| 5,499,272 | A | 3/1996 | Bottomley |
| 5,553,102 | A | 9/1996 | Jasper et al. |
| 5,613,219 | A | 3/1997 | Vogel et al. |
| 5,675,590 | A | 10/1997 | Alamouti |
| 5,790,570 | A | 8/1998 | Heegard et al. |
| 5,848,103 | A | 12/1998 | Weerackody |
| 5,924,034 | A | 7/1999 | Dupuy |
| 5,943,372 | A | 8/1999 | Gans et al. |
| 5,949,833 | A | 9/1999 | Weerackody |
| 5,960,039 | A | 9/1999 | Martin et al. |
| 5,991,331 | A | 11/1999 | Chennakeshu et al. |
| 6,034,987 | A | 3/2000 | Chennakeshu et al. |
| 6,094,465 | A | 7/2000 | Stein et al. |
| 6,115,427 | A | 9/2000 | Calderbank et al. |
| 6,144,711 | A | 11/2000 | Raleigh et al. |
| 6,185,258 | B1 | 2/2001 | Alamouti et al. |
| 6,188,736 | B1 | 2/2001 | Lo et al. |
| 6,393,074 | B1 | 5/2002 | Mandyam et al. |
| 6,470,043 | B1 | 10/2002 | Lo et al. |
| 6,549,585 | B2 | 4/2003 | Naguib et al. |

FOREIGN PATENT DOCUMENTS

| | | |
|---|---|---|
| DE | 298 24 760 U1 | 6/2002 |
| DE | 298 24 761 U1 | 6/2002 |
| DE | 298 24 762 U1 | 6/2002 |
| DE | 298 24 763 U1 | 6/2002 |
| DE | 298 24 765 U1 | 6/2002 |
| EP | 0 767 546 A2 | 4/1997 |
| EP | 1 016 228 B1 | 6/2003 |
| GB | 2 280 575 A | 2/1995 |
| GB | 2 290 010 A | 12/1995 |
| GB | 2 311 445 A | 9/1997 |
| WO | WO 91/20142 A1 | 12/1991 |
| WO | WO 95/22214 A1 | 8/1995 |
| WO | WO 97/24849 | 7/1997 |
| WO | WO 97/41670 | 11/1997 |
| WO | WO 98/09385 | 3/1998 |
| WO | WO 99/14871 | 3/1999 |

OTHER PUBLICATIONS

Winters, J.H., "The Diversity Gain of Transmit Diversity in Wireless Systems with Rayleigh Fading," *Proceeding of the 1994 ICC/SUPERCOMM*, New Orleans, vol. 2, pp. 1121–1125, May 1994.

Wittneben, A. "A New Bandwidth Efficient Transmit Antenna Modulation Diversity Scheme For Linear Digital Modulation," *Proceeding of the 1993 IEEE International Conference on Communications* (IICC '93), pp. 1630–1634, May 1993.

Wittneben, A. "Base Station Modulation Diversity for Digital SIMULCAST," *Proceeding of the 1991 IEEE Vehicular Technology Conference* (VTC 41$^{st}$), pp. 848–853, May 1991.

Seshadri N. et al., "Advanced Techniques for Modulation, Error Correction, Channel Equalization and Diversity," *AT&T Tech. Journal* 47(4): 48–63, Jul. 1993.

Seshadri N. et al., "Space–Time Codes for Wireless Communication: Code Construction," IEEE 47$^{th}$ Vehicular Technology Conf., Phoenix, pp. 637–641, May 1997.

Tarokh, V., et al.,"Space–Time Codes for High Data Rate Wireless Communication: Performance Criteria," IEEE International Conference on Communications, Montreal, 1:299–303, Jun. 1997.

Tarokh, V., et al.,"Space–Time Codes for High Data Rate Wireless Communication: Performance Criteria and Code Construction," *IEEE Trans on Infor Theory* 44(2): 744–765, Mar. 1998.

Alamouti, S., "A Simple Transmit Diversity Technique for Wireless Communications," *IEEE Journal on Selected Areas in Communications IEEE* 16(8): 1451–1458, Oct. 1998.

Blanco, M.A. & Zdunek, K., "Performance and Optimization of Switched Diversity Systems for the Detection of Signals with Rayleigh Fading," *IEEE Transactions on Communications*, 27(12):1887–1895, (Dec. 1979).

Blanco, M.A. & Zdunek; K., "On the Optimization of Simple Switched Diversity Receivers," 1978 IEEE Conference on Communications and Power, Montreal, Canada, pp. 114–117, (1978).

Cavers, James K., "An Analysis of Pilot Symbol Assisted Modulation for Rayleigh Fading Channels," *IEEE Transactions on Vehicular Technology*, Nov. 1991, pp. 686–693, vol. 40, No. 4, The Institute of Electrical and Electronics Engineers, Inc., New York, NY.

Foschini, G.J. and Gans, M.J., " On Limits of Wireless Communications in a Fading Environment when Using Multiple Antennas," *Wireless Personal Communications* 6:311–335, (1998).

Foschini, G.J., "Layered Space–Time Architecture for Wireless Communication in a Fading Environment when Using Multi–Element Antennas", *Bell Technical Labs Journal*, pp. 41–59, (1996).

Hinderling, J. et al., "CDMA Mobile Station Modem ASIC," *IEEE 1992 Custom Integrated Circuits Conference* pp. 10.2.1–10.2.5, (1992).

Kerr, R. et al., "The CDMA Digital Cellular System: An ASIC Overview," *IEEE 1992 Custom Integrated Circuits Conference* pp. 10.1.1–10.1.7, (1992).

Naguib, Ayman et al., "A Space–Time Coding Modem for High–Data–Rate Wireless Communications," *IEEE Journal On Selected Areas in Communications*, Oct. 1998, pp. 1459–1478, The Institute of Electrical and Electronics Engineers, Inc., New York, NY.

Pikholtz, R.L. et al., " Theory of Spread Spectrum Communications—A Tutorial," *IEEE Transactions on Communications*, 30(5):855–884, (1992).

Sampei, Seiichi et al., "Rayleigh Fading Compensation Method for 16QAM in Digital Land Mobile Radio Channels," *Proceeding of the 1989 IEEE Vehicular Technology Conference*, May 1989, pp. 640–646, The Institute of Electrical and Electronics Engineers, Inc., New York, NY.

Tarokh, V. et al., "Space Time Codes for High Data Rate Wireless Communication: Performance Criteria in the Presence of Channel Estimation Errors, Mobility, and Multiple Paths", *IEEE Transactions on Communications* 47(2):199–207, (1999).

Tarokh, Vahid et al., "Combined Array Processing and Space–Time Coding," *IEEE Transactions on Information Theory*, May 1999, pp. 1121–1128, vol. 45, No. 4, The Institute of Electrical and Electronics Engineers, Inc., New York, NY.

Ungerboeck, Gottfried, "Channel Coding with Multilevel/Phase Signals," *IEEE Transactions on Information Theory*, Jan. 1982, pp. 56–57, vol. IT–28, No. 1, The Institute of Electrical and Electronics Engineers, Inc., New York, NY.

Weerackody, V., "Diversity for the Direct–Sequence Spread Spectrum System Using Multiple Transmit Antennas," Proceedings of the IEEE International Conference on Communications, May 23–26, 1993, Geneva, vol. 3, pp. 1775–1779.

Winters, J.H., Salz, J., Gitlin, R.D., "The Impact of Antenna Diversity on the Capacity of Wireless Communications Systems," IEEE Transactions on Communications, vol. 42, No. 2, Feb./Mar./Apr. 1994, pp. 1740–1751, IEEE Communications Society, New York.

LOW COMPLEXITY MAXIMUM LIKELIHOOD DETECTION OF CONCATENATED SPACE CODES FOR WIRELESS APPLICATIONS

REFERENCE TO RELATED APPLICATIONS

This application is a continuation of U.S. patent application Ser. No. 10/005,095, filed on Dec. 3, 2001, which is a divisional of U.S. patent application Ser. No. 09/167,422, filed on Oct. 5, 1998, now U.S. Pat. No. 6,501,803, which claims the benefit of U.S. Provisional Application No. 60/063,794, filed Oct. 31, 1997.

BACKGROUND OF THE INVENTION

This invention relates to wireless communication and, more particularly, to techniques for effective wireless communication in the presence of fading and other degradations.

The most effective technique for mitigating multipath fading in a wireless radio channel is to cancel the effect of fading at the transmitter by controlling the transmitter's power. That is, if the channel conditions are known at the transmitter (on one side of the link), then the transmitter can pre-distort the signal to overcome the effect of the channel at the receiver (on the other side). However, there are two fundamental problems with this approach. The first problem is the transmitter's dynamic range. For the transmitter to overcome an xdB fade, it must increase its power by xdB which, in most cases, is not practical because of radiation power limitations, and the size and cost of amplifiers. The second problem is that the transmitter does not have any knowledge of the channel as seen by the receiver (except for time division duplex systems, where the transmitter receives power from a known other transmitter over the same channel). Therefore, if one wants to control a transmitter based on channel characteristics, channel information has to be sent from the receiver to the transmitter, which results in throughput degradation and added complexity to both the transmitter and the receiver.

Other effective techniques are time and frequency diversity. Using time interleaving together with coding can provide diversity improvement. The same holds for frequency hopping and spread spectrum. However, time interleaving results in unnecessarily large delays when the channel is slowly varying. Equivalently, frequency diversity techniques are ineffective when the coherence bandwidth of the channel is large (small delay spread).

It is well known that in most scattering environments antenna diversity is the most practical and effective technique for reducing the effect of multipath fading. The classical approach to antenna diversity is to use multiple antennas at the receiver and perform combining (or selection) to improve the quality of the received signal.

The major problem with using the receiver diversity approach in current wireless communication systems such as IS-136 and GSM, is the cost, size and power consumption constraints of the receivers. For obvious reasons, small size, weight and cost are paramount. The addition of multiple antennas and RF chains (or selection and switching circuits) in receivers is presently not be feasible. As a result, diversity techniques have often been applied only to improve the up-link (receiver to base) transmission quality with multiple antennas (and receivers) at the base station. Since a base station often serves thousands of receivers, it is more economical to add equipment to base stations rather than the receivers Recently, some interesting approaches for transmitter diversity have been suggested. A delay diversity scheme was proposed by A. Wittneben in "Base Station Modulation Diversity for Digital SIMULCAST," Proceeding of the 1991 IEEE Vehicular Technology Conference (VTC 41st), PP. 848–853, May 1991, and in "A New Bandwidth Efficient Transmit Antenna Modulation Diversity Scheme For Linear Digital Modulation," in Proceeding of the 1993 IEEE International Conference on Communications (IICC '93), PP. 1630–1634, May 1993. The proposal is for a base station to transmit a sequence of symbols through one antenna, and the same sequence of symbols—but delayed—through another antenna.

U.S. Pat. No. 5,479,448, issued to Nambirajan Seshadri on Dec. 26, 1995, discloses a similar arrangement where a sequence of codes is transmitted through two antennas. The sequence of codes is routed through a cycling switch that directs each code to the various antennas, in succession. Since copies of the same symbol are transmitted through multiple antennas at different times, both space and time diversity are achieved. A maximum likelihood sequence estimator (MLSE) or a minimum mean squared error (MMSE) equalizer is then used to resolve multipath distortion and provide diversity gain. See also N. Seshadri, J. H. Winters, "Two Signaling Schemes for Improving the Error Performance of FDD Transmission Systems Using Transmitter Antenna Diversity," *Proceeding of the 1993 IEEE Vehicular Technology Conference* (VTC 43rd), pp. 508–511, May 1993, and J. H. Winters, "The Diversity Gain of Transmit Diversity in Wireless Systems with Rayleigh Fading," *Proceeding of the 1994 ICC/SUPERCOMM*. New Orleans, Vol. 2, PP. 1121–1125, May 1994.

Still another interesting approach is disclosed by Tarokh, Seshadri, Calderbankand Naguib in U.S. application, Ser. No. 08/847635, filed Apr. 25, 1997 (based on a provisional application filed Nov. 7. 1996), where symbols are encoded according to the antennas through which they are simultaneously transmitted, and are decoded using a maximum likelihood decoder. More specifically, the process at the transmitter handles the information in blocks of M1 bits, where M1 is a multiple of M2, i.e., M1=k*M2. It converts each successive group of M2 bits into information symbols (generating thereby k information symbols), encodes each sequence of k information symbols into n channel codes (developing thereby a group of n channel codes for each sequence of k information symbols), and applies each code of a group of codes to a different antenna.

Yet another approach is disclosed by Alamouti and Tarokh in U.S. application, Ser. No. 09/074,224, filed May 5, 1998, and titled "Transmitter Diversity Technique for Wireless Communications" where symbols are encoded using only negations and conjugations, and transmitted in a manner that employs channel diversity.

Still another approach is disclosed by the last-mentioned inventors in a U.S. application filed Jul. 14, 1998, based on provisional application 60/052,689 filed Jul. 17, 1997, titled "Combined Array Processing and Space-Time Coding" where symbols are divided into groups, where each group is transmitted over a separate group of antennas and is encoded with a group code C that is a member of a product code.

SUMMARY

An advance in the art is realized with a transmitter that employs a trellis coder followed by a block coder. Correspondingly, the receiver comprises a Viterbi decoder followed by a block decoder. Advantageously, the block coder and decoder employ time-space diversity coding which, illustratively, employs two transmitter antennas and one receiver antenna.

DETAIL DESCRIPTION

Figure 1:
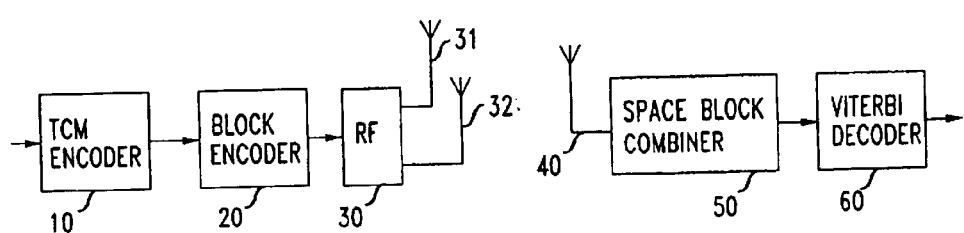
FIG. 1 presents a block diagram of an embodiment in conformance with the principles of this invention.

FIG. 1 presents a block diagram of an arrangement comporting with the principles of this invention. It comprises a trellis code modulation (TCM) encoder 10 followed by a two-branch space block encoder 20. The output is applied to antenna circuitry 30. which feeds antenna 31, and antenna 32. FIG. 1 shows only two antennas, but this is merely illustrative. Arrangements can be had with a larger number of antennas, and it should be understood that the principles disclosed herein apply with equal advantage to such arrangements.

TCM encoder 10 generates complex numbers that represent constellation symbols, and block encoder 20 encodes (adjacent) pairs of symbols in the manner described in the aforementioned Ser. No. 09/074,224 application. That is, symbols $s_0$ and $s_1$, forming a pair, are sent to antenna 31 and antenna 32, respectively, and in the following time period symbols $-s_1^*$ and $s_0^*$ are sent to antennas 31 and 32, respectively. Thereafter, symbols $s_2$ and $s_3$ are sent to antenna 31 and 32, respectively, etc. Thus, encoder 20 creates channel diversity that results from signals traversing from the transmitter to the receiver at different times and over different channels.

The signals transmitted by antennas 31 and 32 are received by a receiver after traversing the airlink and suffering a multiplicative distortion and additive noise. Hence, the received signals at the two consecutive time intervals during which the signals $s_0$, $s_1$, $-s_1^*$, and $s_0^*$ are sent correspond to:

$$r_0(t) = h_0 s_0 + h_1 s_1 + n_0 \quad (1)$$

and $$r_1(t) = h_1 s_0^* - h_0 s_1^* + n_1 \quad (2)$$

where $h_0$ represents the channel from antenna 31, $h_1$ represents the channel from antenna 32, $n_0$ is the received noise at the first time interval, and $n_1$ is the received noise at the second time interval.

The receiver comprises a receive antenna 40, a two-branch space block combiner 50. and a Viterbi decoder 60. The receiver also includes a channel estimator; but since that is perfectly conventional and does not form a part of the invention. FIG. 1 does not explicitly show it. The following assumes that the receiver possesses $\tilde{h}_0$ and $\tilde{h}_1$, which are estimates of $h_0$ and $h_1$, respectively. Thus the received signals at the first and second time intervals are combined in element 50 to form signals $$\tilde{s}_0 = \tilde{h}_0' r_0 + \tilde{h}_1 r_1', \quad (3)$$

and $$\tilde{s}_1 = \tilde{h}_1' r_0 - \tilde{h}_0 r_1', \quad (4)$$

and those signals are applied to Viterbi decoder 60.

The Viterbi decoder builds the following metric for the hypothesized branch symbol $s_1$ corresponding to the first transmitted symbol $s_0$:

$$M(s_0, s_i) = d^2[\tilde{s}_0, (|\tilde{h}_0|^2 + |\tilde{h}_1|^2) s_i]. \quad (5)$$

Similarly, the Viterbi decoder builds the following metric for the hypothesized branch symbol $s_i$ corresponding to the first transmitted symbol $s_1$:

$$M(s_1, s_i) = d^2[\tilde{s}_1, (|\tilde{h}_0|^2 + |\tilde{h}_1|^2) s_i]. \quad (6)$$

(Additional metrics are similarly constructed in arrangements that employ a larger number of antennas and a correspondingly larger constellation of signals transmitted at any one time.) If Trellis encoder 10 is a multiple TCM encoder, then the Viterbi decoder builds the following metric:

$$M[(s_0, s_1), (s_i, s_j)] = M(s_0, s_i) + M(s_1, s_j). \quad (7)$$

or equivalently, $$M[(s_0, s_i), (s_0, s_j)] = d^2(r_0, \tilde{h}_0 s_i + \tilde{h}_1 s_j) + d^2(r_1, \tilde{h}_1 s_i'' - \tilde{h}_0 s_j'). \quad (8)$$

The Viterbi decoder outputs estimates of the transmitted sequence of signals.

The above presented an illustrative embodiment. However, it should be understood that various modifications and alternations might be made by a skilled artisan without departing from the spirit and scope of this invention.

We claim:

1. A transmitter comprising:
   a trellis encoder, wherein the trellis encoder generates a first symbol and a second symbol, and
   a block encoder responsive to the trellis encoder and adapted to feed a plurality of antennas, wherein the block encoder generates a block including the first symbol, the second symbol, a third symbol generated using a complex conjugation, negation, or negative complex conjugation of the first symbol, and a fourth symbol generated using a complex conjugation, negation, or negative complex conjugation of the second symbol.

2. The transmitter of claim 1 further comprising the plurality of antennas.

3. The transmitter of claim 1 wherein the trellis encoder is a multiple trellis code modulation encoder.

4. The transmitter of claim 1 wherein the block encoder is a multi-branch block encoder.

5. The transmitter of claim 1 wherein the block encoder is a space-time block encoder.

6. In a transmitter, a method for linking trellis codes with block codes, the method comprising:
   receiving input data;
   trellis encoding the received data, including generating complex numbers, each complex number representing a constellation symbol;
   receiving the generated complex numbers;
   block encoding the received complex numbers, including generating a block of symbols, wherein the block of symbols includes the generated complex numbers and at least one of a complex conjugation, negation, or negative complex conjugation of at least some of the generated complex numbers; and
   outputting the blocks of symbols for transmission by two or more transmitting antennas.

7. The method of claim 6 wherein the received data is binary data.

8. The method of claim 6 wherein the block encoding includes taking a first complex number and a second complex number as input and generating a complex conjugate of the first complex number and a negative complex conjugate of the second complex number.

9. The method of claim 6 wherein the block encoding includes ordering the block to provide a first complex number, a second complex number, a negative complex conjuration of the second complex number and a complex conjugation of the first complex number.

10. The method of claim 6, further comprising, transmitting the blocks of symbols over the two or more antennas.

11. In a transmitter, an apparatus for generating encoded symbols for transmission over a wireless link, the apparatus comprising:

means for receiving input data;

means, coupled to the means for receiving input data, for generating a first symbol and a second symbol; and means, coupled to the means for generating first and second symbols, for generating a block, the block including the first symbol, the second symbol, a third symbol generated using a complex conjugation, negation, or negative complex conjugation of the first symbol, and a fourth symbol generated using a complex conjugation, negation, or negative complex conjugation of the second symbol.

12. The apparatus of claim 11 further comprising:

means for sending, at a first time, the first symbol from a first antenna and the second symbol from a second antenna; and means for sending, at a second time, the forth symbol from the first antenna and the third symbol from the second antenna.

13. The apparatus of claim 11 further comprising:

means for sending, on a first carrier the first symbol from a first antenna and the second symbol from a second antenna; and means for sending, on a second carrier, the third symbol from a second antenna and the fourth symbol from a first antenna.

14. The apparatus of claim 11 wherein the block is generated using a two-branch space block encoder.

15. The apparatus of claim 11 wherein the block is generated using a multiple-branch space block encoder.

* * * * *

UNITED STATES PATENT AND TRADEMARK OFFICE
CERTIFICATE OF CORRECTION

PATENT NO. : 6,853,688 B2
DATED : February 8, 2005
INVENTOR(S) : Siavash Alamouti et al.

It is certified that error appears in the above-identified patent and that said Letters Patent is hereby corrected as shown below:

Column 2,
Line 32, "Calderbankand" should be -- Calderbank and --;

Column 5,
Line 4, "conjuration" should be -- conjugation --;

Column 6,
Line 6, "forth" should be -- fourth --.

Signed and Sealed this

Third Day of January, 2006

JON W. DUDAS
*Director of the United States Patent and Trademark Office*

UNITED STATES PATENT AND TRADEMARK OFFICE
CERTIFICATE OF CORRECTION

PATENT NO. : 6,853,688 B2
APPLICATION NO. : 10/334343
DATED : February 8, 2005
INVENTOR(S) : Siavash Alamouti et al.

It is certified that error appears in the above-identified patent and that said Letters Patent is hereby corrected as shown below:

At col. 2, line 33, after "Nov. 7, 1996)," insert -- now U.S. Pat. No. 6,115,427 --.

At col. 2, line 45, after "May 5, 1998," insert -- now U.S. Pat No. 6,185,258 --.

At col. 2, line 53, after "Jul. 17, 1997," insert -- now U.S. Pat. No. 6,127,971 --.

At col. 3, line 21, delete "Ser. No. 09/074,224 application" and insert therefor --U.S. Pat. No. 6,185,258--.

Signed and Sealed this

Twenty-ninth Day of May, 2007

JON W. DUDAS
*Director of the United States Patent and Trademark Office*